US012676177B2

(12) United States Patent
Vogelsang et al.

(10) Patent No.: US 12,676,177 B2
(45) Date of Patent: Jul. 7, 2026

(54) DYNAMIC RANDOM ACCESS MEMORY (DRAM) WITH CONFIGURABLE WORDLINE AND BITLINE VOLTAGES

(71) Applicant: Rambus Inc., San Jose, CA (US)

(72) Inventors: Thomas Vogelsang, Mountain View, CA (US); Brent Steven Haukness, Sunnyvale, CA (US); Gary Bela Bronner, Los Altos, CA (US)

(73) Assignee: Rambus Inc., San Jose, CA (US)

( * ) Notice: Subject to any disclaimer, the term of this patent is extended or adjusted under 35 U.S.C. 154(b) by 203 days.

(21) Appl. No.: 18/566,558

(22) PCT Filed: May 31, 2022

(86) PCT No.: PCT/US2022/031597
§ 371 (c)(1),
(2) Date: Dec. 1, 2023

(87) PCT Pub. No.: WO2022/256322
PCT Pub. Date: Dec. 8, 2022

(65) Prior Publication Data
US 2024/0257860 A1      Aug. 1, 2024

Related U.S. Application Data

(60) Provisional application No. 63/195,306, filed on Jun. 1, 2021.

(51) Int. Cl.
*G11C 11/4074* (2006.01)
*G06F 12/02* (2006.01)
(Continued)

(52) U.S. Cl.
CPC ...... *G11C 11/4074* (2013.01); *G06F 12/0223* (2013.01); *G11C 11/4085* (2013.01); *G11C 11/4091* (2013.01)

(58) Field of Classification Search
CPC ............ G11C 11/4074; G11C 11/4085; G11C 11/4091; G11C 11/4094; G11C 2207/2227; G11C 5/147; G06F 12/0223
(Continued)

(56) References Cited

U.S. PATENT DOCUMENTS 6,751,152 B2    6/2004  Hsu et al.
6,885,233 B2    4/2005  Huard et al.
(Continued)

OTHER PUBLICATIONS

Notification of Transmittal of the International Search Report and the Written Opinion of the International Searching Authority, or the Declaration with Mail Date Oct. 19, 2022 re: Int'l Appln. No. PCT/US2022/031597. 16 pages.

*Primary Examiner* — Huan Hoang
(74) *Attorney, Agent, or Firm* — Lance Kreisman; Peninsula Patent Group

(57)                ABSTRACT

A dynamic random access memory (DRAM) device includes memory core circuitry and power supply circuitry. The memory core circuitry includes an array of DRAM storage cells, with ones of the DRAM storage cells coupled to wordline and bitline power supply busses. The power supply circuitry is coupled to the wordline and bitline power supply busses. The power supply circuitry is responsive to a control signal to generate one of a first set of respective wordline and bitline voltages for application to the wordline and bitline power supply busses in a first normal mode of operation, or to generate a second set of respective wordline and bitline voltages for application to the wordline and bitline power supply busses in a second normal mode of operation. A value of the control signal is based on a temperature parameter associated with the DRAM device.

20 Claims, 5 Drawing Sheets

(51) Int. Cl.
  *G11C 11/408*      (2006.01)
  *G11C 11/4091*     (2006.01)

(58) Field of Classification Search
  USPC ......................................................... 365/149
  See application file for complete search history.

(56)                  References Cited

U.S. PATENT DOCUMENTS

|  |  |  |  |
|---|---|---|---|
| 7,009,904 B2 | 3/2006 | Kim | |
| 7,266,031 B2 | 9/2007 | Kim et al. | |
| 9,256,376 B2 | 2/2016 | Tsern et al. | |
| 10,431,291 B1 * | 10/2019 | Derner | G11C 11/4091 |
| 10,839,863 B2 | 11/2020 | Best et al. | |
| 2016/0224272 A1 | 8/2016 | Kim | |
| 2017/0117033 A1 | 4/2017 | Doo et al. | |
| 2017/0287876 A1 | 10/2017 | Park | |
| 2019/0206478 A1 | 7/2019 | Jun | |
| 2020/0258567 A1 | 8/2020 | Lim et al. | |

* cited by examiner

| Function | Register Type | Operand | | Data | |
|---|---|---|---|---|---|
| Mode of setting maximum operating temperature 402 | Write | Bits in MRS command, e.g., op[0] | 404 | e.g., 0   Set by MRS<br>1   Set using internal temperature sensor | 406 |
| Maximum Operating Temperature 408 | Write | Bits in MRS command, e.g., op[2:1] | 410 | e.g., 00   RFU<br>01   10°C<br>10   40°C<br>11   85°C | 412 |

1

DYNAMIC RANDOM ACCESS MEMORY (DRAM) WITH CONFIGURABLE WORDLINE AND BITLINE VOLTAGES

CROSS REFERENCES TO RELATED APPLICATIONS

This application is a national stage application of international application number PCT/US2022/31597, filed May 31, 2022, which claims the benefit of U.S. Provisional Application No. 63/195,306, filed Jun. 1, 2021, all of which are incorporated by reference herein in their entirety.

TECHNICAL FIELD

The disclosure herein relates to memory systems, and more specifically to memory devices, controllers and methods for configuring wordline and bitline voltages based on temperature.

BRIEF DESCRIPTION OF THE DRAWINGS

Embodiments of the disclosure are illustrated by way of example, and not by way of limitation, in the figures of the accompanying drawings and in which like reference numerals refer to similar elements and in which:

FIG. 2 illustrates one embodiment of the memory core circuitry of FIG. 1.

FIG. 4 illustrates one embodiment of a Table specifying how to set a maximum operating temperature using a mode register set (MRS) command.

DETAILED DESCRIPTION

Embodiments of dynamic random access memory (DRAM) devices, controllers, associated methods and integrated circuits are disclosed herein. One embodiment of an integrated circuit (IC) DRAM memory device includes memory core circuitry and power supply circuitry. The memory core circuitry includes an array of DRAM storage cells, with ones of the DRAM storage cells coupled to wordline and bitline power supply busses. The power supply circuitry is coupled to the wordline and bitline power supply busses. The power supply circuitry is responsive to a control signal to generate one of a first set of respective wordline and bitline voltages for application to the wordline and bitline power supply busses in a first normal mode of operation, or to generate a second set of respective wordline and bitline voltages for application to the wordline and bitline power supply busses in a second normal mode of operation. A value of the control signal is based on a temperature parameter associated with the DRAM device.

Specific embodiments described herein provide apparatus and methods that provide the ability to configure wordline and bitline voltages for a memory device based on a temperature parameter. Respective wordline and bitline voltages may thus be managed to enhance overall reliability of the memory device and to efficiently control overall power consumption within the memory device.

Figure 1:
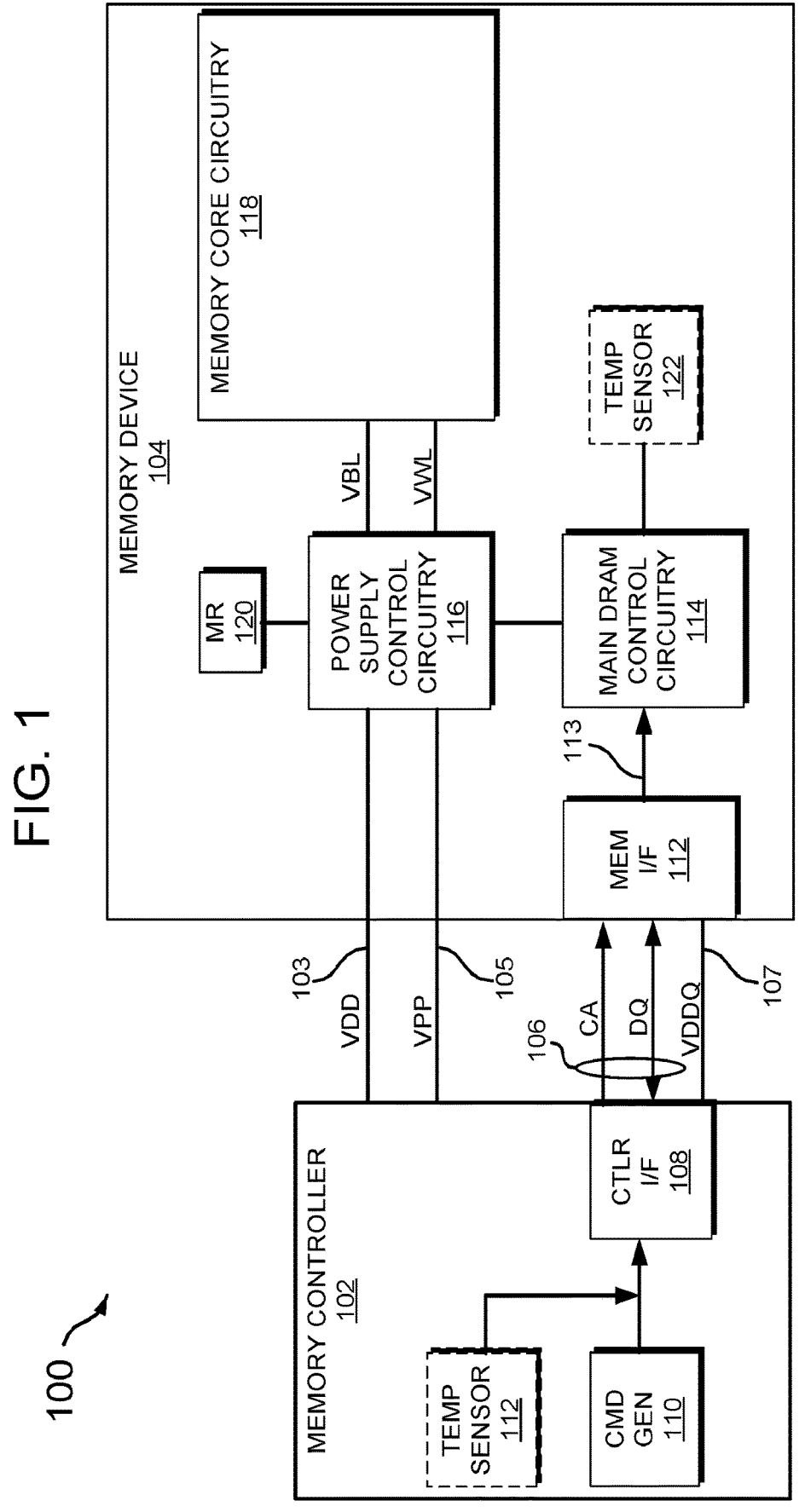
FIG. 1 illustrates one embodiment of a memory system that employs configurable wordline and bitline voltages.

With reference to FIG. 1, a memory system, generally designated 100, is shown that includes a memory controller 102 coupled to a memory device 104 via bus 106. For one embodiment, the memory controller 102 is a dynamic random access memory (DRAM) controller, with the memory device 104 realized as a DRAM memory device. In some embodiments, the memory controller 102 and memory device 104 may be embodied as integrated circuits, or chips. Other embodiments may employ the memory controller 102 as a circuit in a general purpose processor. Specific embodiments for the DRAM memory controller 102 and memory device 104 may be compliant with various DRAM standards, including double data rate (DDR) variants, low power (LPDDR) versions, and graphics (GDDR) types. Other embodiments may include multi-chip modules that, for example, employ stacked memory die, or stacked packages. Such embodiments may be used with memory modules. Additional embodiments may stack memory die and logic die together in a common package, or in separate packages stacked upon each other.

Further referring to FIG. 1, the memory controller 102 includes a controller interface 108 for transferring data, command and control signals between the memory controller and the memory device 104 via the bus or channel 106. Command generation circuitry 110 generates various memory access commands for read and write operations, and mode register set (MRS) commands for transmission to the memory device 104. For one embodiment, explained below, the command generation circuitry 110 generates MRS commands that are externally applied to the DRAM memory device 104 to configure or reconfigure applied wordline and bitline voltages. In some embodiments, temperature sensing circuitry in the form of a temperature sensor 112 is employed in the memory controller 102 to monitor an operating temperature of the memory controller 102 as a proxy for the operating temperature of the DRAM memory device 104. The temperature sensor 112 provides real-time temperature data that may be utilized in the configuring of the wordline and bitline voltages, discussed in further detail below.

With continued reference to FIG. 1, several power supply busses 103, 105 and 107 are shown that are disposed between the memory controller 102 and the DRAM memory device 104. The busses 103, 105 and 107 supply respective source voltages VDD, VPP and VDDQ to the DRAM memory device 104 in accordance with a particular device standard. Generally, the voltage VDD represents a main power supply voltage, while the voltage VDDQ represents an input/output (I/O) power supply voltage. The voltage VPP typically represents a supply voltage for a wordline voltage. Although shown as being provided to the DRAM memory device 104 by the memory controller 102, for other embodiments, the voltages VDD, VPP and VDDQ may be generated off-chip and supplied to the memory device 104 by a circuit other than the memory controller 102. As described more fully below, the voltages VPP and VDD are regulated and/or charged to various values for use as memory core wordline and bitline power supply voltages VWL and VBL.

Further referring to FIG. 1, the DRAM memory device 104 includes a memory interface 112 that communicates with the memory controller 102. The memory interface 112 forwards the various command and control signals from the memory controller 102 along a main command/control bus 113 to main DRAM control circuitry 114. The main DRAM control circuitry 114 manages distribution of the command and control signals, including the controller-generated MRS commands, throughout the memory device 104.

With continued reference to FIG. 1, power supply control circuitry 116 couples to the main DRAM control circuitry 114. The power supply control circuitry 116 generates the respective bitline and wordline power supply voltages VBL and VWL at certain values based on a temperature parameter and supplies the voltages for use by memory core circuitry 118. Further detail regarding one embodiment of the memory core circuitry 118 is described below and illustrated in FIG. 2. An optional temperature sensor 122 disposed on the memory device 104 provides temperature information (as an alternative to the controller-based temperature sensor 112) to set the bitline and wordline power supply voltages VBL and VWL. One specific embodiment for the power supply control circuitry 116 is set forth in detail below and illustrated in FIG. 3.

Further referring to FIG. 1, for one embodiment, configuration circuitry in the form of mode register circuitry 120, stores a mode control value indicating a particular configuration mode of operation for generating the wordline and bitline voltages VWL and VBL. For one embodiment, placing the DRAM memory device 104 in a first configuration mode operates the DRAM memory device 104 at higher bitline and wordline voltages for a relatively low range of operating temperatures. Placing the DRAM memory device 104 in a second configuration mode operates the DRAM memory device 104 at lower bitline and wordline voltages for a relatively high range of operating temperatures. The mode value may be stored upon initialization of the memory device 104 and/or set via an MRS command dispatched by the host memory controller 102 and fed to the mode register circuitry 120 via the main DRAM control circuitry 114. Further detail relating to the mode register circuitry is explained below with one embodiment of an MRS command table shown in FIG. 4. For other embodiments, the configured mode of operation may be set by other programming techniques, such as by programming a fuse, such as an e-fuse or antifuse.

Figure 2:
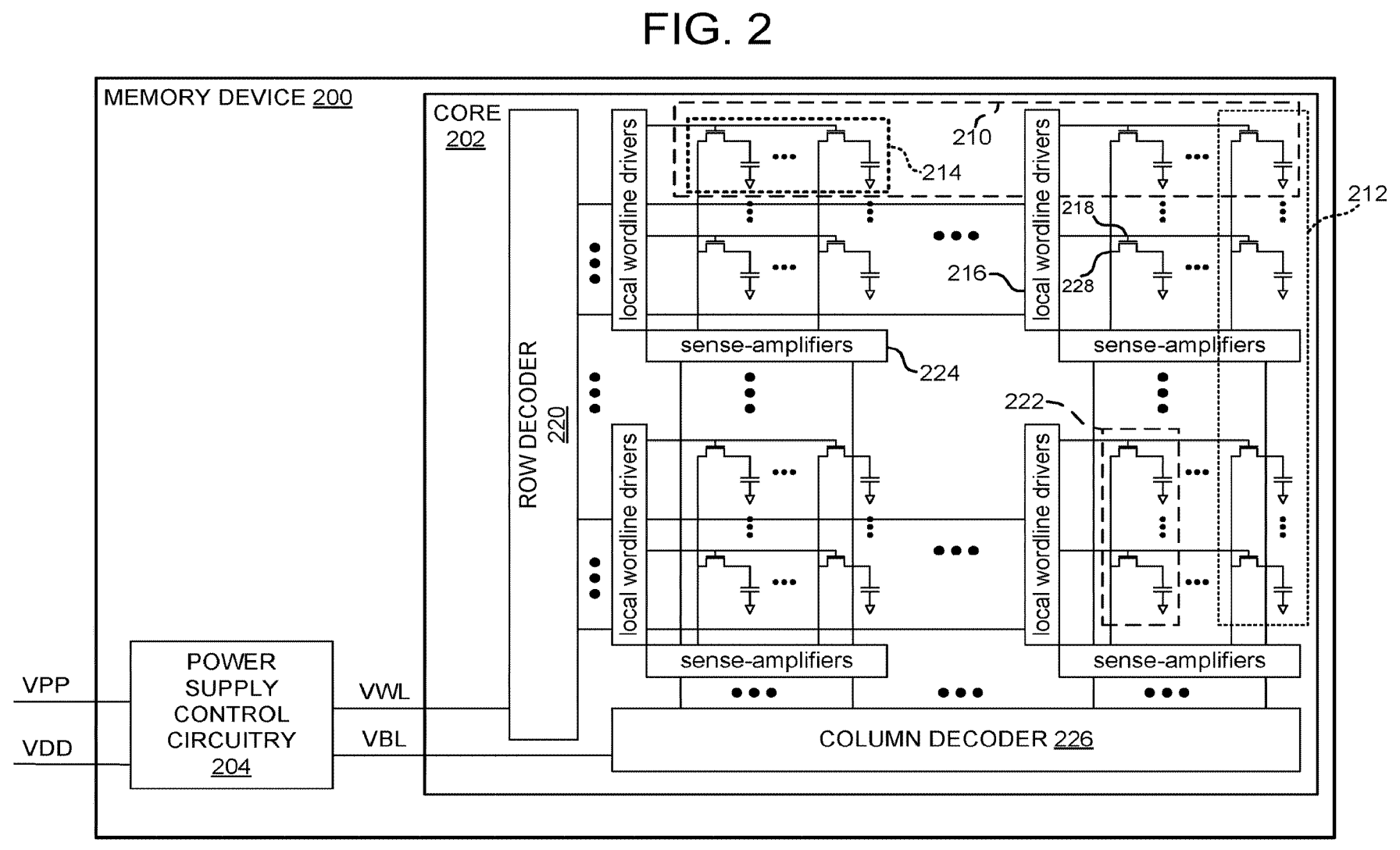

FIG. 2 illustrates further memory core features in a DRAM memory device 200 for one specific implementation of memory core circuitry 202 corresponding to the memory core circuitry 118 of FIG. 1. The memory core circuitry 202 is generally organized into rows of storage cells, such as at 210, connected by signals often referred to as wordlines, and columns of storage cells, such as at 212. The wordlines may be further segmented into local wordlines 214 and include local wordline drivers 216 to distribute a voltage corresponding to the wordline voltage to a gate terminal (such as at 218) of each storage cell in a given local wordline. A row decoder 220 receives the wordline voltage from power supply control circuitry 204 and applies the wordline voltage VWL to the local wordline drivers 216. In a similar manner, the columns of storage cells 212 may be further organized into sub-blocks, such as at 222, each connected to sense-amplifiers 224 that receive bitline voltages applied by sense amplifiers 224. A column decoder 226 distributes the bitline voltage VBL from the power supply control circuitry 204 to the sense amplifiers 224 for application to a source terminal of each of the storage cells, such as at 228. As more fully explained below, the values of the wordline and bitline voltages VWL and VBL may be set differently for different operating temperatures of the DRAM memory device 200 in an effort to optimize device reliability and/or power characteristics.

Figure 3:
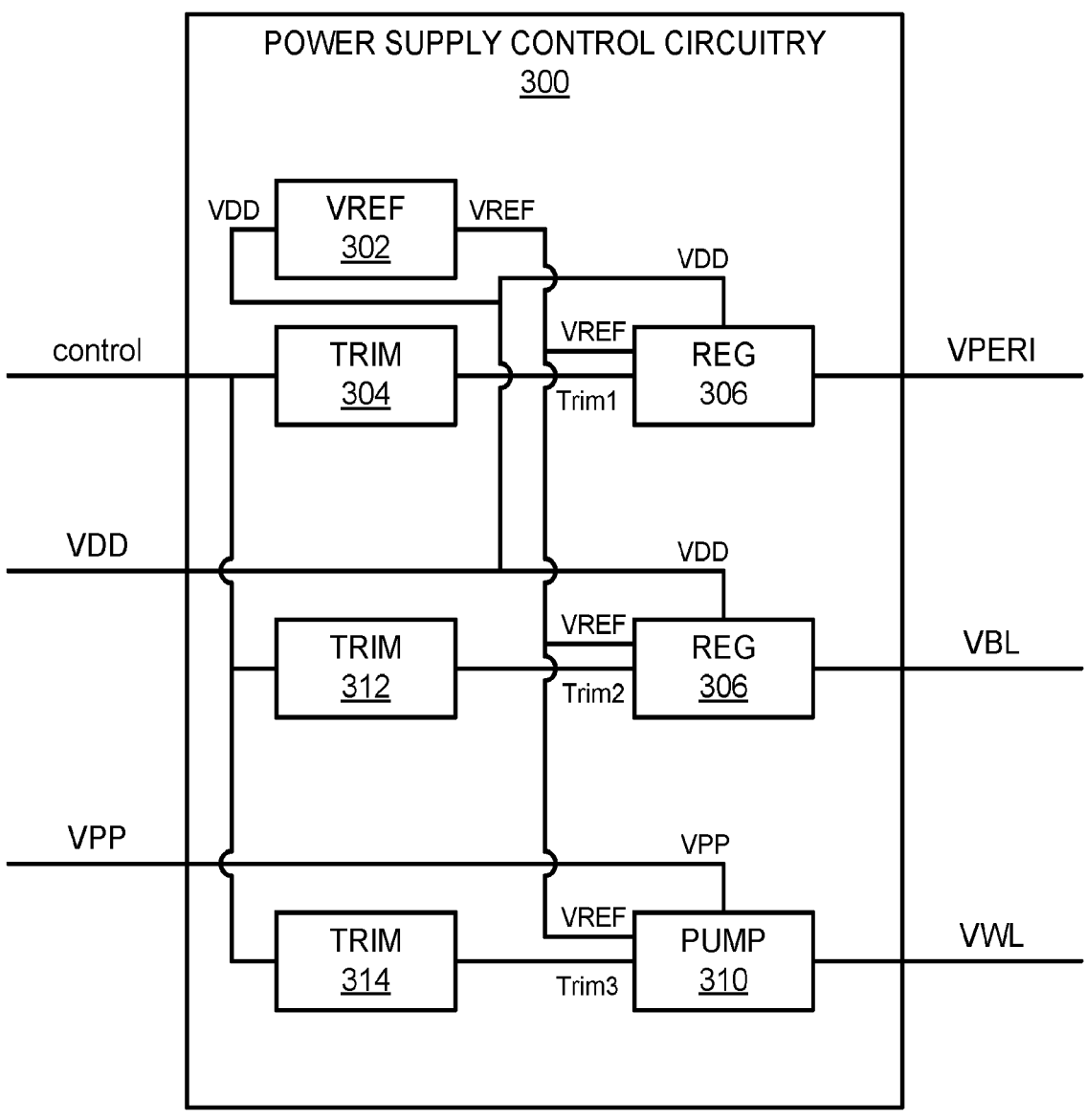
FIG. 3 illustrates one embodiment of the power supply control circuitry of FIG. 1.

Further detail pertaining to how the different wordline and bitline voltages VWL and VBL are generated and distributed is provided in FIG. 3, which illustrates one specific embodiment of power supply control circuitry 300 (corresponding to the power supply control circuitry 116 of FIG. 1 and 204 of FIG. 2). The power supply control circuitry 300 receives the main power supply voltage VDD and the supply voltage VPP from off-chip, such as from the memory controller 102 or some other power supply source. Alternatively, the wordline voltage may be generated from a charge pump supplied by the main power supply voltage VDD. Other supply voltages may also be received and regulated or charged but are not shown for purposes of brevity. In general, a given supply voltage may be generated either with a voltage regulator, if the target output voltage is positive and lower than the supply from which it is generated, or with a charge pump, if the target output voltage is negative or higher than the supply from which it is generated.

Further referring to FIG. 3, the power supply control circuitry 300 also receives a control signal "control" from the main DRAM control circuitry 114. A value of the control signal generally corresponds to the mode value stored in the mode register circuitry 120. For one embodiment, the control signal value is used for setting the wordline and bitline voltages VWL and VBL to a selected set of predetermined voltage values.

With continued reference to FIG. 3, a reference voltage generator 302 receives the main power supply voltage VDD and produces a reference voltage VREF based on the value of VDD. For one embodiment, the reference voltage generator 302 produces the reference voltage VREF in a manner that is process, input voltage and temperature (PVT) independent, thus producing a fixed or constant voltage regardless of power supply variations, temperature changes, or circuit loading from a device. For one embodiment, a bandgap voltage reference circuit generates the reference voltage VREF.

The reference voltage VREF is then fed from the reference voltage generator 302 as an input to first and second voltage regulators 306, 308 and a charge pump 310. The first voltage regulator 306 is powered by the main voltage supply VDD and receives both the reference voltage VREF and a first trim signal Trim1 from a first trim circuit 304. The first trim circuit 304 sets the output voltage of the first voltage regulator 306 relative to the reference voltage VREF based on the value of the control signal "control." The output of the first voltage regulator 306 is set such that it generates a peripheral voltage value VPERI, which is used by general logic employed on the DRAM memory device 104. The second voltage regulator 308 is also powered by the main voltage supply VDD and receives both the reference voltage VREF and a second trim signal Trim2 from a second trim circuit 312 that operates to set the output voltage of the second voltage regulator 308 relative to the reference voltage VREF based on the value of the control signal "control." The output of the second voltage regulator 308 is set such that it generates a bitline voltage VBL, which is applied to the sense amplifiers 224 in the DRAM memory device core circuitry 202. To generate the wordline voltage output VWL, the charge pump 310 responds to receiving the supply voltage VPP, the reference voltage VREF, and a third trim setting Trim3 from a third trim circuit 314. As noted above, in many circumstances the charge pump 310 operates to generate its output wordline voltage VWL at a higher value than the input source voltage VPP. There may be situations, however, where depending on the level, the wordline voltage VWL may be regulated below the supply voltage VPP.

With continued reference to FIG. 3, while discussed mainly in terms of employing configurable wordline and bitline voltages herein, for some embodiments, the DRAM memory device 104 may utilize a configurable or adjustable peripheral voltage VPERI (outside of the memory core circuitry 202). This may be accomplished via the first trim circuit 304 and voltage regulator 306. For instance, in some applications, the peripheral voltage VPERI may move opposite to the wordline and bitline voltages such that it is lower in the low temperature mode than in the high temperature mode.

As noted above, for one embodiment, mode register circuitry 120 (FIG. 1) stores a mode control value that is used to generate a control signal to configure the DRAM memory device in using a predetermined set of wordline and bitline voltages VWL and VBL based on a temperature parameter associated with the DRAM memory device 104. FIG. 4 illustrates a Table that shows how an MRS command dispatched by the memory controller 102 (FIG. 1) can serve to set the mode control value. For a first command function, such as configuring a mode of setting a maximum operating temperature, at 402, a single-bit value in an operand field, at 404, may indicate whether the mode of setting the maximum operating temperature is to be set by an MRS command (with a data bit in data field 406 indicating a bit value of "0") or set by using an internal temperature sensor (with the data bit indicating a bit value of "1"). For a second command function, such as specifying the maximum operating temperature, at 408, a multi-bit value in operand field 410 may indicate one of a selection of predefined maximum temperature values, such as 10 degrees Celsius (with the data bits in data field 412 indicating "01"), 40 degrees Celsius (with the data bits indicating "10"), or 85 degrees Celsius (with the data bits indicating "11"). Each of the specified maximum temperature values corresponds to a predetermined set of wordline and bitline voltages to be generated and distributed in the memory core circuitry 202.

In operation, the DRAM memory device 104 and controller 102 provide the ability to configure bitline and wordline voltages to optimize the reliability and efficiency of the memory system depending on a temperature parameter, such as an expected or actual operating temperature environment. For some applications, a structural change in the DRAM memory device 104, such as the incorporation of thinner capacitor dielectrics, may take advantage of reduced wordline and bitline voltages with enhanced cooling techniques to significantly lower the DRAM memory device operating temperature with a reduction in power consumption without a loss in performance. In other applications, legacy DRAM memory devices may utilize configurable wordline and bitline voltage capabilities to reduce wordline and bitline voltages under certain operating temperature conditions to improve reliability (an intrinsic failure rate over time due to temperature-dependent mechanisms), albeit at potentially reduced levels of performance.

Figure 5:
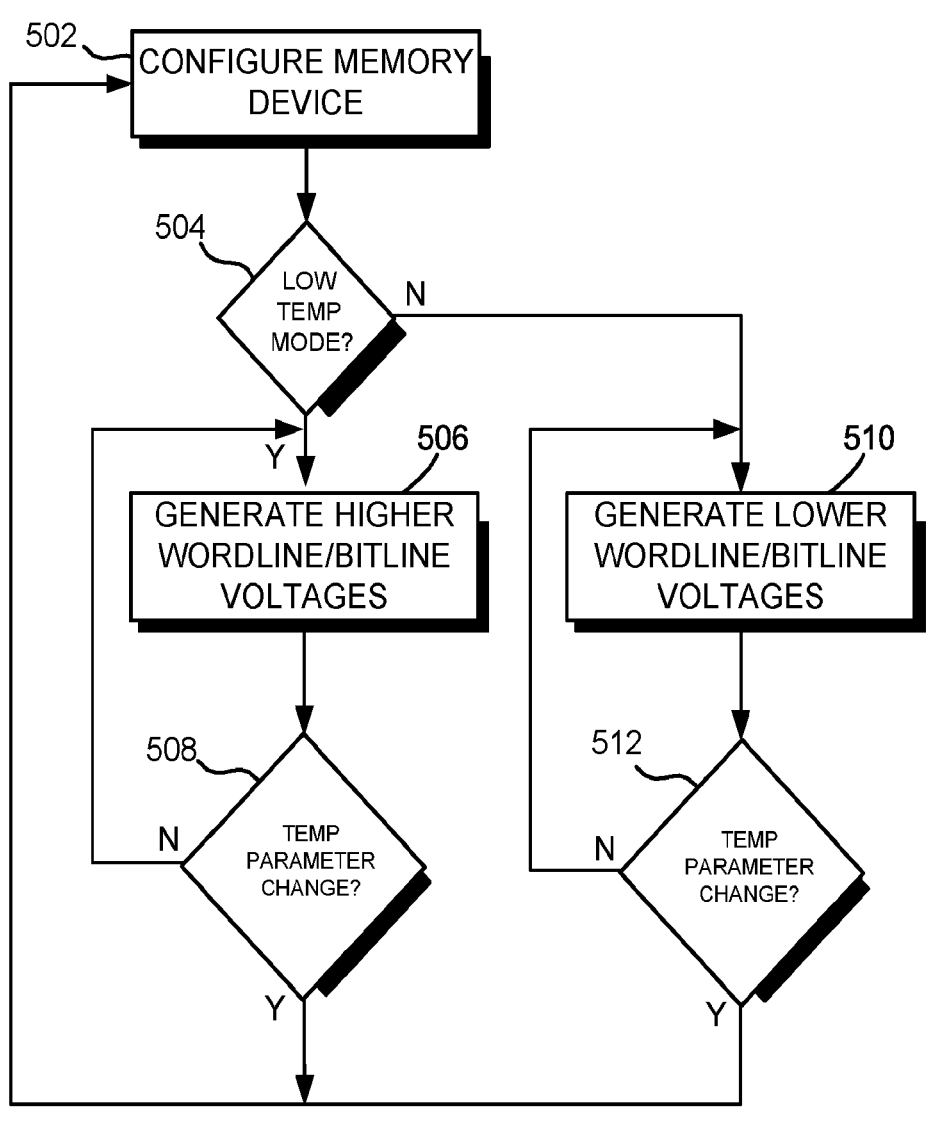
FIG. 5 illustrates a flowchart for one embodiment of a method of operation for the memory system of FIG. 1.

FIG. 5 illustrates a flowchart of one embodiment of a method of operation consistent with the embodiments described above. During an initialization process, such as when the memory system 100 (FIG. 1) is first powered on, the DRAM memory device 104 is configured, at 502, to operate in either a low temperature normal mode for normal data transfer operations (as opposed to a test or calibration mode of operation) or a high temperature normal mode for normal data transfer operations. For one embodiment, this may be accomplished through loading of a particular mode value from non-volatile storage into the mode register circuitry 120, and/or through receipt of one or more MRS commands from the host memory controller 102. Depending on the application, the low temperature normal mode of operation may correspond to a maximum operating temperature of, for example, 10° C., and appropriately identified as such a configuration by the MRS command bits. The high temperature normal mode of operation may correspond to a maximum operating temperature of, for example, 85° C., and appropriately identified as such a configuration by the MRS command bits.

Once configured, the DRAM memory device 104 determines the temperature mode configuration, at 504. If the DRAM memory device determines that its configuration setting is for a low temperature normal mode of operation, then an appropriate control signal value is generated by the main DRAM control circuitry 114 and fed to the power supply control circuitry 116. The trim circuits 312 and 314 in the power supply control circuitry 300 respond to the control signal by providing a corresponding adjustment setting to the voltage regulator 308 and charge pump 310 to generate an appropriate first set of "higher" bitline VBL and wordline VWL voltages, at 506, ("higher" in relation to a second set of bitline and wordline voltages used for increased temperature applications) for use during operation where temperatures are expected to reach a maximum temperature no greater than 10° C. Such temperatures may be achievable, for example, through aggressive cooling technologies such as liquid or cryogenic cooling systems.

Once to the wordline and bitline voltages are configured, the DRAM memory device 104 operates with the bitline and wordline voltage setting. At 508, the temperature of the DRAM memory device 104 is monitored during operation, and if no changes in the temperature parameter are detected, then no changes to the wordline and bitline voltages are made. However, if a temperature parameter change is detected (such as a change in actual operating temperature above the specified maximum temperature, or a subsequent MRS command specifying a different operating mode is received), then operation reverts back to configuring (at this point, reconfiguring) the DRAM memory device 104, at 502, with knowledge of the new temperature parameter change.

With continued reference to FIG. 5, with the DRAM memory device 104 initially configured to operate in a low temperature normal mode of operation, and subsequently incurring a change in the temperature parameter, the main DRAM control circuitry 114 evaluates the temperature information and dispatches an updated control signal to the power supply control circuitry 300. The trim circuitry 312 and 314 in the power supply control circuitry 300 responds to the updated control signal by providing a new adjustment setting to the voltage regulator 308 and charge pump 310 to generate an appropriate second set of "lower" bitline VBL and wordline VWL voltages, at 510, ("lower" in relation to the first set of "higher" bitline and wordline voltages) for use during operation where temperatures are expected to reach a maximum temperature no greater than 85° C. Monitoring of the DRAM memory device 104 in light of any temperature parameter changes is carried out, at 512, similar to the monitoring at 508, and may result in a further configuration change, at 502, depending on the application.

For one embodiment, the method of operation shown in FIG. 5 incorporates static configuration steps, such as those shown in 502, 504, 506 and 510 to set an appropriate bitline VBL and wordline VWL voltage as part of the DRAM initialization process. For such an embodiment, any further monitoring of temperature may be optional, as are any reconfiguring steps for changing the wordline and bitline voltages in response to a measured temperature, such as at steps 508 and 512.

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multi-conductor signal links. Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using metal oxide semiconductor (MOS) technology, bipolar technology or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '$\overline{<signalname>}$') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement.

While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

We claim:

1. A dynamic random access memory (DRAM) device, comprising:
   memory core circuitry including an array of DRAM storage cells, ones of the DRAM storage cells coupled to a wordline power supply bus and a bitline power supply bus;
   power supply circuitry coupled to the wordline and bitline power supply busses, responsive to a control signal, to generate a first set of respective wordline and bitline voltages for distribution to the wordline and bitline power supply busses in a first normal mode of operation, or to generate a second set of respective wordline and bitline voltages that is different than the first set of respective wordline and bitline voltages for distribution to the wordline and bitline power supply busses in a second normal mode of operation; and
   wherein a value of the control signal is based on a temperature parameter associated with the DRAM device.

2. The DRAM device of claim 1, further comprising:
   mode control circuitry to generate the control signal.

3. The DRAM device of claim 2, wherein the mode control circuitry comprises:
   mode register storage to store a mode value that is used to generate the control signal.

4. The DRAM device of claim 3, wherein the mode control circuitry is responsive to receipt of a mode register set (MRS) command to initiate storage of the mode value.

5. The DRAM device of claim 2, wherein the temperature parameter comprises operating temperature, and the mode control circuitry is responsive to receipt of operating temperature information to generate the control signal.

6. The DRAM device of claim 5, wherein the control circuitry further comprises a temperature sensor to generate actual operating temperature information.

7. The DRAM device of claim 5, wherein the control circuitry further comprises a sensor input to receive actual operating temperature information from an off-chip temperature sensor.

8. The DRAM device of claim 5, wherein the operating temperature information comprises an expected maximum operating temperature value.

9. The DRAM device of claim 6, wherein:
   the first set of wordline and bitline voltages is higher than the second set of wordline and bitline voltages; and
   wherein the first set of wordline and bitline voltages is selected when the temperature information is within a first temperature range, and the second set of wordline and bitline voltages selected when the temperature information is within a second temperature range that is higher than the first temperature range.

10. The DRAM device of claim 6, further comprising:
    wordline driver circuitry coupled to the power supply circuitry and the wordline power supply bus;

sense amplifier circuitry coupled to the power supply circuitry and the bitline power supply bus;

wherein the power supply circuitry is operative to generate the first set or second set of wordline and bitline voltages for application to the wordline driver circuitry and the sense amplifier circuitry; and wherein the wordline driver circuitry and the sense amplifier circuitry are operative to distribute the first set or second set of wordline and bitline voltages along the wordline power supply bus and the bitline power supply bus.

11. An integrated circuit (IC) dynamic random access memory (DRAM) device, comprising:

memory core circuitry including an array of DRAM storage cells, ones of the DRAM storage cells coupled to wordline and bitline power supply busses;

wherein for a first normal mode of operation, the wordline and bitline power supply busses supply a first predetermined set of wordline and bitline voltages to the DRAM storage cells; and wherein for a second normal mode of operation, the wordline and bitline power supply busses supply a second predetermined set of wordline and bitline voltages that is different than the first predetermined set of wordline and bitline voltages to the DRAM storage cells; and mode control circuitry to generate a mode control signal to control a selection between the first and second normal modes of operation based on a temperature parameter associated with the IC DRAM device.

12. The IC DRAM device of claim 11, wherein the mode control circuitry further comprises:

mode register storage to store a mode value that is used to generate the mode control signal.

13. The IC DRAM device of claim 12, wherein the mode control circuitry is responsive to receipt of a mode register set (MRS) command to initiate storage of the mode value.

14. The IC DRAM device of claim 11, wherein the temperature parameter comprises operating temperature, and the mode control circuitry is responsive to receipt of operating temperature information to generate the control signal.

15. The IC DRAM device of claim 14, wherein the mode control circuitry further comprises a temperature sensor to generate operating temperature information.

16. The IC DRAM device of claim 14, wherein the mode control circuitry further comprises a sensor input to receive operating temperature information from an off-chip temperature sensor.

17. A method of operation in a dynamic random access memory (DRAM) device, the method comprising:

storing data in an array of DRAM storage cells, ones of the DRAM storage cells coupled to wordline and bitline power supply busses;

generating, in response to a first value of a control signal, one of a first set of predefined wordline and bitline voltages for application to the wordline and bitline power supply busses in a first normal mode of operation;

generating, in response to a second value of the control signal, a second set of predefined wordline and bitline voltages that is different than the first set of respective wordline and bitline voltages for application to the wordline and bitline power supply busses in a second normal mode of operation; and controlling the value of the control signal based on a temperature parameter associated with the DRAM device.

18. The method of claim 17, further comprising:

storing a mode value that is used to generate the control signal in mode register storage.

19. The method of claim 18, further comprising:

initiating storage of the mode value in response to receipt of a mode register set (MRS) command.

20. The method of claim 19, further comprising:

generating the control signal based on receipt of operating temperature information.

* * * * *